US011019856B2

(12) United States Patent
Lin

(10) Patent No.: US 11,019,856 B2
(45) Date of Patent: Jun. 1, 2021

(54) TEMPERATURE CONTROLLABLE TEXTILE AND WEARABLE ASSEMBLY THEREOF

(71) Applicant: INTELLIGENCE TEXTILE TECHNOLOGY CO., LTD., Taipei (TW)

(72) Inventor: Chen-Hsiang Lin, Taipei (TW)

(73) Assignee: INTELLIGENCE TEXTILE TECHNOLOGY CO., LTD., Taipei (TW)

( * ) Notice: Subject to any disclaimer, the term of this patent is extended or adjusted under 35 U.S.C. 154(b) by 483 days.

(21) Appl. No.: 16/115,788

(22) Filed: Aug. 29, 2018

(65) Prior Publication Data

US 2019/0328054 A1    Oct. 31, 2019

(30) Foreign Application Priority Data

Apr. 27, 2018 (TW) ................. 107114590

(51) Int. Cl.
*H05B 1/02* (2006.01)
*A41D 13/005* (2006.01)
(Continued)

(52) U.S. Cl.
CPC ........... *A41D 13/005* (2013.01); *A41D 1/002* (2013.01); *A41D 13/0051* (2013.01); *A41D 13/0053* (2013.01); *B32B 5/024* (2013.01); *B32B 5/06* (2013.01); *B32B 5/26* (2013.01); *D02G 3/38* (2013.01); *D02G 3/441* (2013.01); *H01L 35/30* (2013.01); *A41D 2400/12* (2013.01);
(Continued)

(58) Field of Classification Search
CPC .... A41D 13/005; A41D 1/002; A41D 13/051; A41D 13/053; D01B 2401/16; D01B 2501/104; D01B 2501/043; B32B 2307/202; B32B 2307/206; B32B 2307/5285; B23B 2307/00; D02G 3/28; H05B 1/02; H05B 2203/013; H05B 2203/015; H05B 3/342; H05B 3/345; H05B 3/347
See application file for complete search history.

(56) References Cited

U.S. PATENT DOCUMENTS 5,105,067 A  *  4/1992  Brekkestran  ....... G05D 23/2401
                                                        2/69
10,292,438 B2 *  5/2019  Fortenbacher  ........... H05B 3/34
(Continued)

*Primary Examiner* — Mark H Paschall
(74) *Attorney, Agent, or Firm* — Schmeiser, Olsen & Watts, LLP

(57) ABSTRACT

A temperature controllable textile having first, second and third conductive cloths and first and second conductive type semiconductor films is illustrated. When positive and negative ends of a direct current power electrically connect to the first and second conductive cloths respectively, first and third junction ends which first and second conductive cloths respectively contact and electrically connect to the first and second conductive type semiconductor films function as a cooling end, and second and fourth junction ends which the third conductive cloth contacts and electrically connect to the first and second conductive type semiconductor films function as a heating end, or the first and third junction ends function as the heating end, and the second and fourth junction ends function as the cooling end.

18 Claims, 9 Drawing Sheets

(51) Int. Cl.
    *A41D 1/00*    (2018.01)
    *B32B 5/02*    (2006.01)
    *B32B 5/06*    (2006.01)
    *B32B 5/26*    (2006.01)
    *D02G 3/38*    (2006.01)
    *D02G 3/44*    (2006.01)
    *H01L 35/30*    (2006.01)

(52) U.S. Cl.
    CPC .... *A41D 2500/20* (2013.01); *B32B 2307/202* (2013.01); *B32B 2307/206* (2013.01); *B32B 2307/5825* (2013.01); *B32B 2437/00* (2013.01); *D10B 2401/16* (2013.01); *D10B 2501/04* (2013.01); *D10B 2501/043* (2013.01)

(56) References Cited

U.S. PATENT DOCUMENTS

| | | | | |
|---|---|---|---|---|
| 2013/0313099 | A1* | 11/2013 | Komaki | H01H 1/64 |
| | | | | 200/600 |
| 2014/0332522 | A1* | 11/2014 | Miura | D01F 8/04 |
| | | | | 219/529 |
| 2019/0334374 | A1* | 10/2019 | Lin | H02J 9/06 |
| 2020/0353239 | A1* | 11/2020 | Daniels | A61B 5/296 |

* cited by examiner

TEMPERATURE CONTROLLABLE TEXTILE AND WEARABLE ASSEMBLY THEREOF

CROSS-REFERENCE TO RELATED APPLICATION

This non-provisional application claims priority under 35 U.S.C. § 119(a) on Patent Application No(s). 107114590 filed in Taiwan, R.O.C. on Apr. 27, 2018, the entire contents of which are hereby incorporated by reference.

FIELD OF THE INVENTION

The present disclosure relates to a textile, in particular, to a temperature controllable textile which is dedicated to cooling, and to a wearable assembly having the temperature controllable textile.

BACKGROUND OF THE INVENTION

As the technology advances, many enterprises try to incorporate electronic components into clothes to form smart clothes. The smart clothes not only measure physiological signals of wearers (i.e. users), but also heat up the wearers. Most of the smart clothes are formed from chips, yarns, electric wires (such as enameled wires) and resistors. The electric wires are embedded or weaved in textiles formed by weaving the yarns. The electric wires are electrically connected to the resistors and the chips. The electric wires can further connect to an external power supply to supply electric power to the resistors and the chips. The chips each have a controller and a sensor for measuring the physiological signal. When the resistors receive the electric power, the received electric power is converted to thermal energy, so as to heat up the smart clothes. Thus, by heating up the smart clothes, the smart clothes prevent the wearers in a cold environment from catching a cold or feeling cold.

Specific materials are required to achieve cooling indirectly in a hot environment.

However, the specific materials are not used in forming the textiles of the smart clothes. As a result, the conventional smart clothes are seldom capable of cooling.

There are several conventional cooling techniques. For example, air compressors compress air to decrease air temperature, thereby achieving cooling. However, air compressors are too bulky to be integrated into the textiles or the smart clothes. Another cooling technique is based on Peltier effect and described below.

When a current passes an interface between two different conductors, the interface absorbs heat from the outside, or releases heat to the outside, and this is known as "Peltier effect". Referring to FIG. 1A and FIG. 1B, FIG. 1A is a schematic diagram showing a cooling device operating by Peltier effect, and FIG. 1B is an equivalent circuit diagram of the cooling device of FIG. 1A. The cooling device 1 comprises two metals 11, 12 having different materials, respectively. The metals 11, 12 are in contact with each other and electrically connected to each other. A positive end and a negative end of a direct current power $V_{DC}$ electrically connect to two opposite sides of the metal 11, respectively.

Since the materials of the metals 11, 12 are not identical to each other, and a closed loop is formed via the direct current power $V_{DC}$, Peltier effect occurs, which causes two junction portions JN1 and JN2 of the metals 11, 12 (i.e. two side interfaces of the metals 11, 12) to induce a temperature deviation. Thus, the junction portions JN1 and JN2 absorb and release heat respectively. Alternatively, the junction portions JN1 and JN2 release and absorb heat respectively. It is worth noting that whether the junction portions JN1 and JN2 absorb and release heat respectively, or release and absorb heat respectively, depends on Seebeck coefficients of the metals 11, 12. Thus, one of the junction portions JN1 and JN2 acts as a cooling end, and the other one of the junction portions JN1 and JN2 acts as a heating end.

In addition to using two different metals to form the cooling device, another cooling device utilizing Peltier effect uses dipoles of different conductive type semiconductors to form different interfaces (i.e. the cooling end and the heating end). Referring to FIG. 2, it is a schematic diagram showing another cooling device utilizing Peltier effect. The cooling device 2 comprises conductors 21A, 21B, 23, a first conductive type semiconductor 22A and a second conductive type semiconductor 22B, wherein the conductors 21A, 21B, 23 have the same material. The conductor 23 is disposed on the first conductive type semiconductor 22A and the second conductive type semiconductor 22B, and is further in contact with the first conductive type semiconductor 22A and the second conductive type semiconductor 22B. The conductors 21A and 21B are disposed under the first conductive type semiconductor 22A and the second conductive type semiconductor 22B respectively, and are further in contact with the first conductive type semiconductor 22A and the second conductive type semiconductor 22B respectively. A positive end and a negative end of the direct current power $V_{DC}$ electrically connect to the conductors 21B and 21A respectively.

Since the dipoles are induced by the first conductive type semiconductor 22A and the second conductive type semiconductor 22B, and a close loop is formed via the direct current power $V_{DC}$, Peltier effect occurs, which causes the conductors 23 and "21A, 21B" to induce a temperature deviation therebetween, such that the conductors 23 and "21A, 21B" absorb and release heat respectively or release and absorb heat respectively. Whether the conductors 23 and "21A, 21B" absorb and release heat respectively or release and absorb heat respectively depends on the conductive types of the first conductive type semiconductor 22A and the second conductive type semiconductor 22B. The conductive type of the first conductive type semiconductor 22A is opposite to the conductive type of the second conductive type semiconductor 22B. Therefore, one of the conductors 23 and "21A, 21B" functions as the cooling end, and other one of the conductors 23 and "21A, 21B" functions as the heating end.

Since the above cooling devices lack water washable and anti-tear characteristics and are simply applied to rigid devices, they cannot act as temperature controllable textiles of the smart clothes. Further, if the above cooling devices are directly disposed in the smart clothes but no consideration is given as to whether the above cooling devices have the water washable and anti-tear characteristics, the formed smart clothes may be perceived as a foreign body by the wearers to the detriment of user experiences.

SUMMARY OF THE INVENTION

According to at least one embodiment of the present disclosure, the present disclosure provides a temperature controllable textile comprising a first, second and third conductive cloths and a first and second conductive type semiconductor films. The first conductive type semiconductor film electrically connects to the first and the third conductive cloths, and is in contact with the first and the third conductive cloths, to form a first junction portion between the first conductive type semiconductor film and the first conductive cloth and a second junction portion between the first conductive type semiconductor film and the third conductive cloth. The second conductive type semiconductor film electrically connects to the first and third conductive cloths, and is in contact with the second and third conductive cloths, to form a third junction portion between the second conductive type semiconductor film and the second conductive cloth and a fourth junction portion between the second conductive type semiconductor film and the third conductive cloth. When positive and negative ends of a direct current power electrically connect to the first and second conductive cloths respectively, the first and third junction portions function as a cooling end, and the second and fourth junction portions function as a heating end, or the first and third junction portions function as the heating end, and the second and fourth junction portions function as the cooling end.

According to at least one embodiment of the present disclosure, the present disclosure provides a wearable assembly comprising any one of the above temperature controllable textiles.

Optionally, the temperature controllable textile further comprises an insulation cloth and an insulation film. The insulation cloth is connected between the first and second conductive cloths and is in contact with the first and second conductive cloths. The insulation film disposed corresponding to the insulation cloth is connected between the first and second conductive type semiconductor films and is in contact with the first and second conductive type semiconductor films.

Optionally, the temperature controllable textile further comprises a first insulated heat-conductive film and a second insulated heat-conductive film. The first insulated heat-conductive film is disposed under the first and second conductive cloths. The second insulated heat-conductive film is disposed on the third conductive cloth.

Optionally, the first conductive type semiconductor film, the insulation film and the second conductive type semiconductor film are formed from a flexible semiconductor film, wherein the flexible semiconductor film has a first conductive type doping region, a second conductive type doping region, and an undoped region, wherein the undoped region is disposed between the first and second conductive type doping regions.

Optionally, the first, second and third conductive cloths each have a plurality of signaling yarns, and the signaling yarn comprises a staple fiber and a sheet conductor. The staple fiber has a strength of 26 to 40 strands and acts as a supporting material. The sheet conductor enlaces a surrounding surface of the staple fiber by taking a spiral course.

Optionally, the first conductive type semiconductor film, the insulation film and the second conductive type semiconductor film are respectively formed of a first conductive type semiconductor cloth, an insulation cloth and a second conductive type semiconductor cloth.

Optionally, the first conductive type semiconductor cloth comprises a plurality of first conductive type semiconductor yarns, and the second conductive type semiconductor cloth comprises a plurality of second conductive type semiconductor yarns. The first conductive type semiconductor yarn comprises a first staple fiber and a first conductive type sheet semiconductor which enlaces a surrounding surface of the first staple fiber by taking a spiral course. The second conductive type semiconductor yarn comprises a second staple fiber and a second conductive type sheet semiconductor which enlaces a surrounding surface of the second staple fiber by taking a spiral course.

Optionally, the first conductive type semiconductor film, the insulation film and the second conductive type semiconductor film are integrally formed of a semiconductor cloth. The semiconductor cloth comprises a plurality of composite semiconductor yarns, and the composite semiconductor yarn comprises a staple fiber and a composite sheet semiconductor which enlaces a surrounding surface of the staple fiber by taking a spiral course. The composite sheet semiconductor is formed by sequentially connecting a first conductive type sheet semiconductor, an undoped sheet semiconductor and a second conductive type sheet semiconductor.

Optionally, the first, second and third conductive cloths and the first and second conductive type semiconductor films are integrally formed a cloth, wherein the cloth comprises a plurality of temperature controllable yarns. The temperature controllable yarn comprises a staple fiber and a composite temperature sheet which enlaces a surrounding surface of the staple fiber by taking a spiral course, wherein the composite temperature sheet is formed by sequentially connecting a first sheet conductor, a first conductive type sheet semiconductor, a second sheet conductor, a second conductive type sheet semiconductor and a third sheet conductor.

To sum up, the present disclosure provides a temperature controllable textile having a cooling end and a heating end, and the temperature controllable textile is able to increase or decrease the temperature of the living body or the object, in the different environments. In addition, the temperature controllable textile is not perceived as a foreign body by the wearer; hence, the wearable assembly formed of the temperature controllable textile provides a satisfactory wearing experience to the wearer.

BRIEF DESCRIPTION OF THE DRAWINGS

In order that the present disclosure may be better understood and readily carried into effect, certain embodiments of the present disclosure are now described with reference to the accompanying drawings, wherein.

DETAILED DESCRIPTION OF THE PREFERRED EMBODIMENTS

Figure 1A:
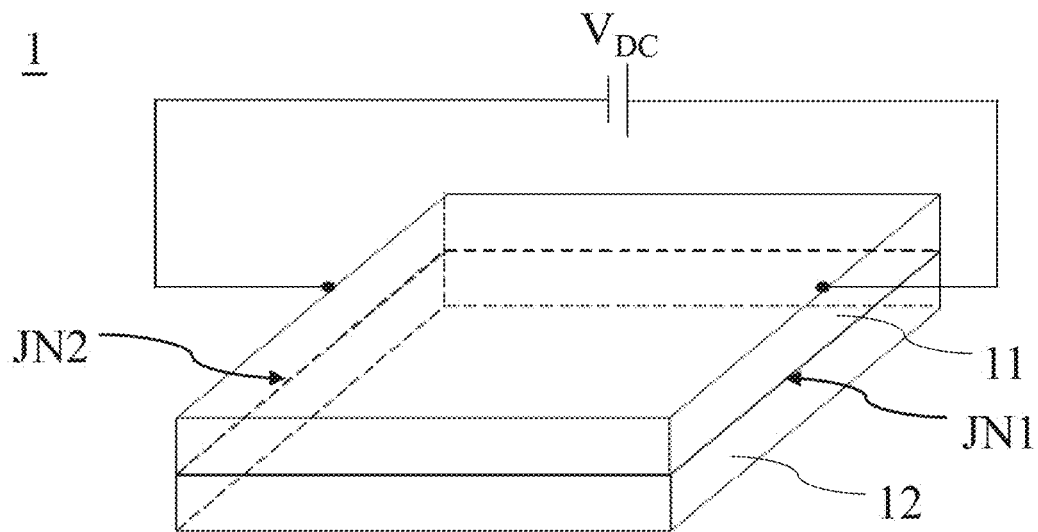
FIG. 1A (Related Art) is a schematic diagram showing a cooling device utilizing Peltier effect.
Figure 1B:
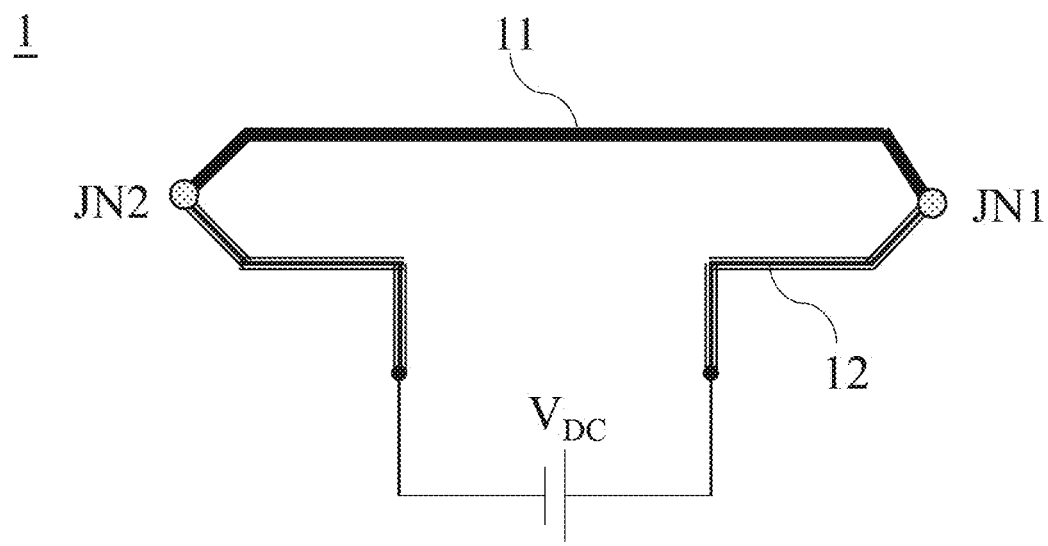
FIG. 1B (Related Art) is an equivalent circuit diagram of the cooling device of FIG. 1A.
Figure 2:
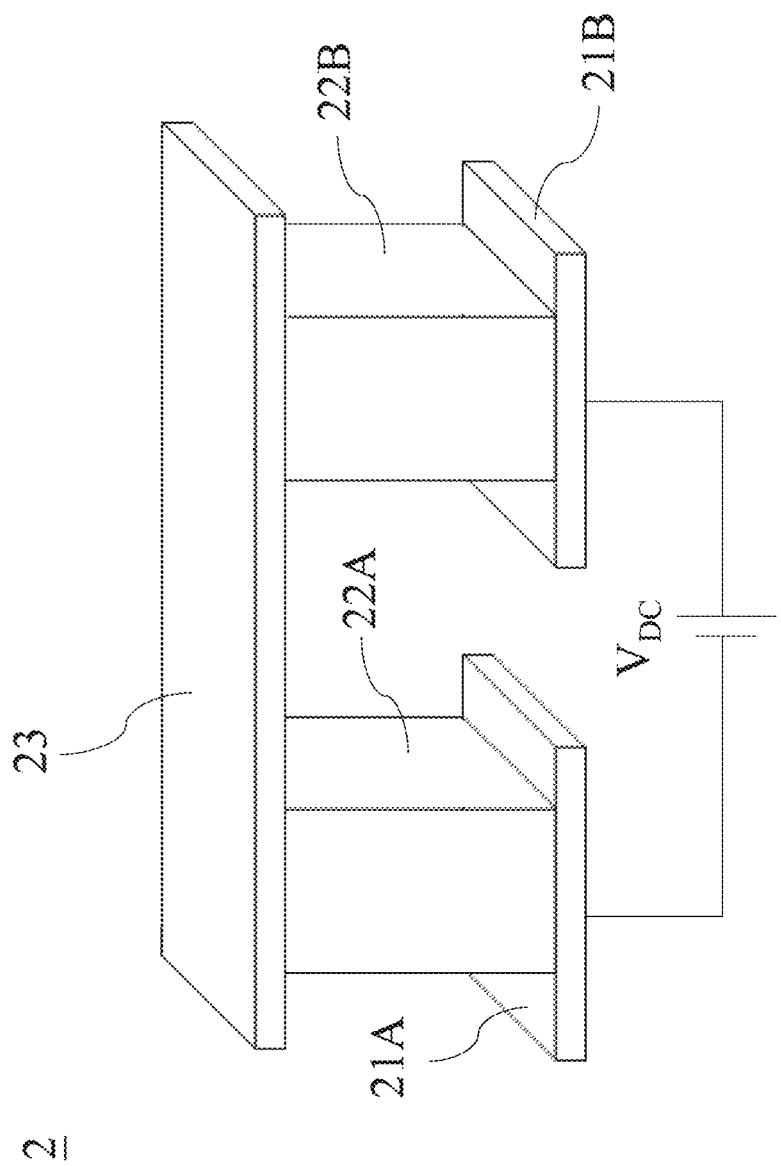
FIG. 2 (Related Art) is a schematic diagram showing another cooling device utilizing Peltier effect.

To make it easier for the examiner to understand the objects, characteristics and effects of this present disclosure, embodiments together with the attached drawings for the detailed description of the present disclosure are provided.

An embodiment of the present disclosure provides a temperature controllable textile which has the water washable and anti-tear characteristics and can be stitched to other textile, so as to form a part of a wearable assembly (such as, smart clothes, smart shoes, smart pant, wristbands or kneecaps). Furthermore, the temperature controllable textile is not only used to form the wearable assembly, but also dedicated for controlling a temperature of a crop, an electronic equipment, a farm animal or other object or living body.

The temperature controllable textile mainly has a first, second and third conductive cloths, a first conductive type semiconductor film and a second conductive type semiconductor film. The first conductive type semiconductor film electrically connects to the first and third conductive cloths, and is disposed between the first and third conductive cloths so as to be in contact with the first and third conductive cloths. The second conductive type semiconductor film electrically connects to the second and third conductive cloths, and is disposed between the second and third conductive cloths so as to be in contact with the second and third conductive cloths. A positive end and a negative end of a direct current power electrically connect to the first and second conductive cloths respectively or electrically connect to the second and first conductive cloths respectively.

Since the first conductive type semiconductor film and the second conductive type semiconductor film induce the dipoles, and a close loop is formed by the direct current power, Peltier effect occurs. Therefore, the junction portions which the first and second conductive cloths contact the first conductive type semiconductor film and the second conductive type semiconductor film to function as a cooling end or a heating end, and the junction portions which the third conductive cloth contacts the first conductive type semiconductor film and the second conductive type semiconductor film function as a heating end or a cooling end.

In the embodiment of the present disclosure, the first, second and third conductive cloths are formed by weaving a plurality of signaling yarns or "the signaling yarns and insulation yarns". The first conductive type semiconductor film and the second conductive type semiconductor film can be implemented as a flexible semiconductor substrate having a first and second conductive type doping regions, or the first conductive type semiconductor film and the second conductive type semiconductor film can be a first conductive type semiconductor cloth and a second conductive type semiconductor cloth respectively, wherein the first conductive type semiconductor cloth and the second conductive type semiconductor cloth are formed of first conductive type semiconductor yarns and second conductive type semiconductor yarns respectively.

In another embodiment of the present disclosure, the first, second and third conductive cloths and the first and second conductive type semiconductor films are integrally formed of a cloth which is formed of a plurality of temperature controllable yarns. A composite temperature sheet of the temperature controllable yarn enlaces a staple fiber of the temperature controllable yarn by taking a spiral course, and the composite temperature sheet is formed by sequentially connecting a first sheet conductor, a first conductive type sheet semiconductor, a third sheet conductor, a second conductive type sheet semiconductor and a second sheet conductor. Thus, locations of the first conductive cloth, the first conductive type semiconductor film, the third conductive cloth, the second conductive type semiconductor film and the second conductive cloth are defined according to locations of the first sheet conductor, the first conductive type sheet semiconductor, the third sheet conductor, the second conductive type sheet semiconductor and the second sheet conductor.

Next, implementation details of the temperature controllable textile can be illustrated accompanying with the drawings. However, it is worth noting that the following embodiments are not intended to limit the present disclosure, and the drawings are schematic. Therefore, dimensions of the components and materials of the components are not intended to limit the present disclosure.

Figure 3:
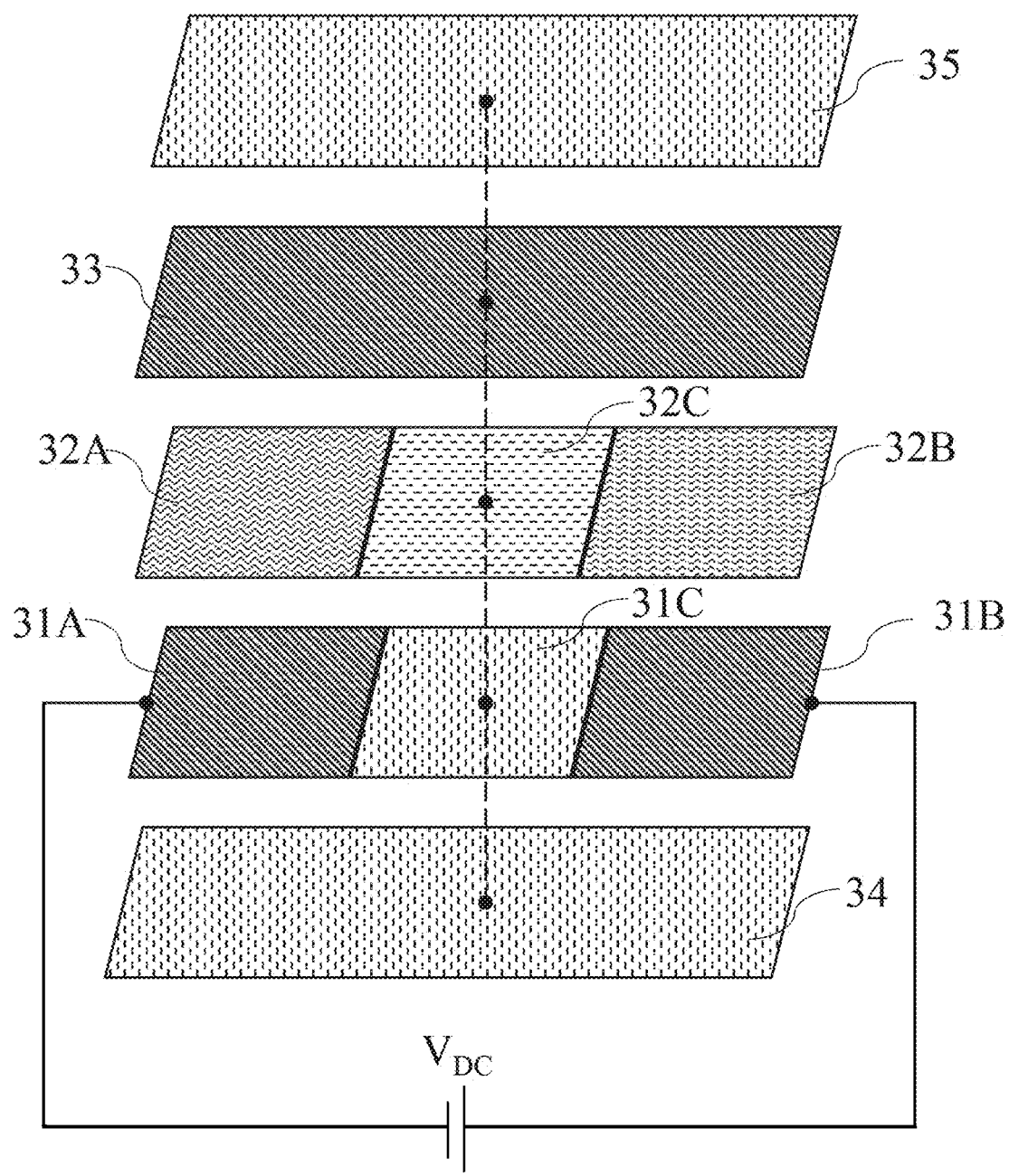
FIG. 3 is an exploded diagram of a temperature controllable textile according to an embodiment of the present disclosure.

Referring to FIG. 3, FIG. 3 is an explosive diagram of a temperature controllable textile according to an embodiment of the present disclosure. A temperature controllable textile 3 comprises conductive cloths 31A, 31B, 33, an insulation cloth 31C, a first conductive type semiconductor film 32A, a second conductive type semiconductor film 32B, an insulation film 32C and insulated heat-conductive films 34, 35.

In the embodiment, the conductive cloths 31A, 31B and the insulation cloth 31C can be stitched to each other, and the insulation film 32C is connected between the first conductive type semiconductor film 32A and the second conductive type semiconductor film 32B, with the locations being corresponding to that of the insulation cloth 31C. The conductive cloths 31A and 31B electrically connect to the first conductive type semiconductor film 32A and the second conductive type semiconductor film 32B respectively, and are further in contact with the first conductive type semiconductor film 32A and the second conductive type semiconductor film 32B respectively. The conductive cloth 33 electrically connects to the first conductive type semiconductor film 32A and the second conductive type semiconductor film 32B, and is in contact with the first conductive type semiconductor film 32A and the second conductive type semiconductor film 32B.

When a positive end and a negative end of a direct current power $V_{DC}$ electrically connect to the conductive cloths 31B and 31A respectively, Peltier effect occurs, which causes the junction portions between the conductive cloths 31B, 31A, the first conductive type semiconductor film 32A and the second conductive type semiconductor film 32B to function as a heat absorbing or releasing interface, and the junction portions between the conductive cloth 33, the first conductive type semiconductor film 32A and the second conductive type semiconductor film 32B to function as the heat releasing or absorbing interface. Since the conductive cloths 31A, 31B and 33 are thin, and thus the conductive cloths "31A and 31B" and 33 equivalently function as the heat absorbing and releasing interfaces (or the heat releasing and absorbing interfaces) respectively. For example, when the first conductive type semiconductor film 32A and the second conductive type semiconductor film 32B are P-type and N-type semiconductor films respectively, the conductive cloths 31B and 31A equivalently function as the heat absorbing interface (i.e. the cooling end), and the conductive cloth 33 equivalently function as the heat releasing interface (i.e. the heating end). By contrast, when the first conductive type semiconductor film 32A and the second conductive type semiconductor film 32B are the N-type and P-type semiconductor films respectively, the conductive cloths 31B and 31A equivalently function as the heat releasing interface (i.e. the heating end), and the conductive cloth 33 equivalently function as the heat absorbing interface (i.e. the cooling end).

In the embodiment of the present disclosure, the conductive cloths 31A, 31B, 33, the insulation cloth 31C, the first conductive type semiconductor film 32A, the second conductive type semiconductor film 32B, the insulation film 32C are stitched and formed as a temperature controllable textile 3. Additionally, when the temperature controllable textile 3 is applied for controlling the temperature of the living body, and the large temperature deviation between the cooling end and the heating end is required, a large current of the direct current power $V_{DC}$ should be required, and preferably, the insulated heat-conductive films 34, 35 should be disposed under "the conductive cloths 31A, 31B and the insulation cloth 31C" respectively and on the conductive cloth 33 by stitching.

In the embodiment of the present disclosure, the conductive cloths 31A, 31B, 33 can be formed by weaving signaling yarns, for example, each of the conductive cloths 31A, 31B, 33 is formed by weaving the signaling yarns, or formed by weaving the signaling yarns and the insulation yarns. Details of the signaling yarns are illustrated later and omitted herein. The insulation cloth 31C is formed by weaving the insulation yarns. Additionally, the first conductive type semiconductor film 32A, the second conductive type semiconductor film 32B and the insulation film 32C can be implemented as a flexible semiconductor substrate, wherein the flexible semiconductor substrate has two opposite regions being the first and second conductive type doping regions respectively, and further has an undoped region disposed between the two opposite regions. Thus, the first conductive type semiconductor film 32A, the second conductive type semiconductor film 32B and the insulation film 32C are formed respectively. The flexible semiconductor substrate can be directly stitched to the conductive cloths 31A, 31B, 33 and the insulation cloth 31C.

Further, the first conductive type semiconductor film 32A, the second conductive type semiconductor film 32B and the insulation film 32C are formed of cloths. For example, the first conductive type semiconductor film 32A can be implemented as the cloth which is formed by weaving first conductive type semiconductor yarns, the second conductive type semiconductor film 32B can be implemented as the cloth which is formed by weaving second conductive type semiconductor yarns, and the insulation film 32C can be implemented as the cloth which is formed by weaving the insulation yarns or undoped semiconductor yarns, wherein the three cloths can be stitched to each other. By the way, implementations of the first and second conductive type semiconductor yarns are illustrated in the following descriptions and omitted herein.

Moreover, the first conductive type semiconductor film 32A, the second conductive type semiconductor film 32B and the insulation film 32C can be implemented as a semiconductor cloth being integrally formed, wherein the semiconductor cloth is formed by weaving composite semiconductor yarns. Details of the composite semiconductor yarns are illustrated in the following descriptions and omitted herein.

Figure 4:
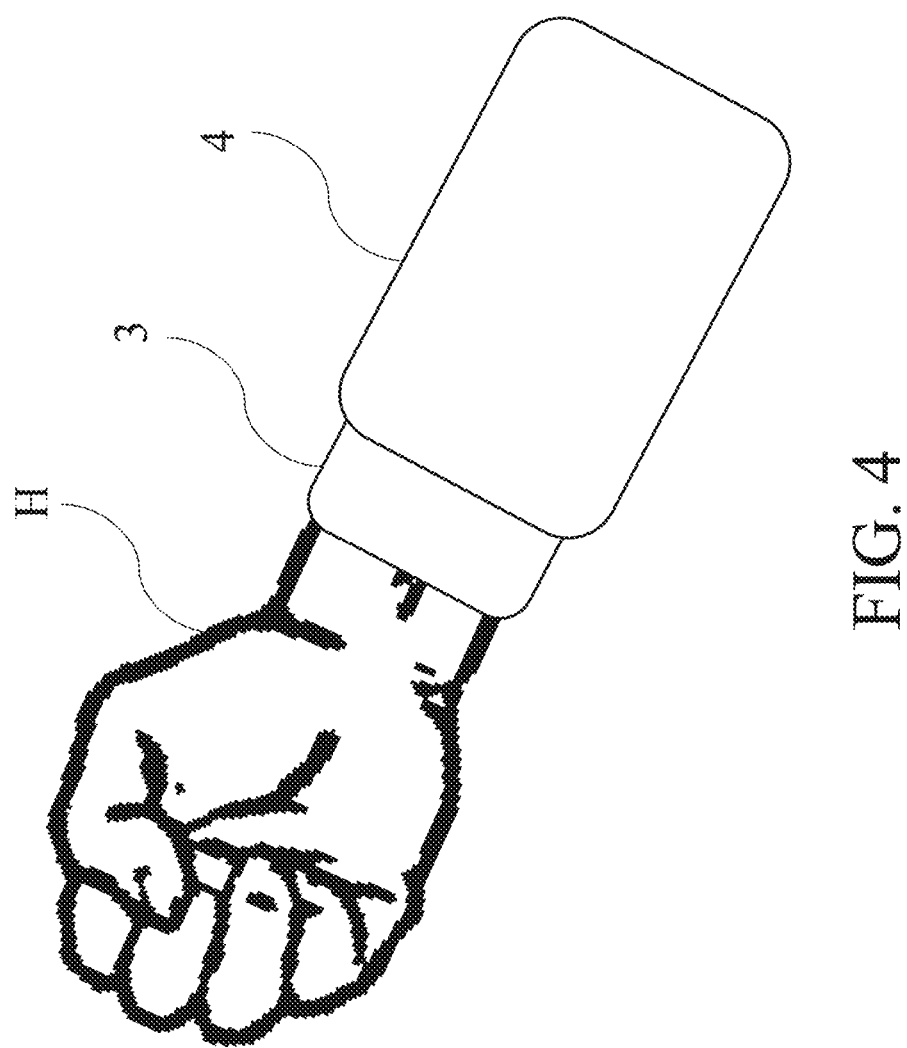
FIG. 4 is a schematic diagram showing the application of the temperature controllable textile for the wearable assembly according to an embodiment of the present disclosure.

Next, referring to FIG. 4, FIG. 4 is a schematic diagram showing the application of the temperature controllable textile for the wearable assembly according to an embodiment of the present disclosure. In the embodiment, the wearable assembly can be the smart clothes which have a temperature controllable textile 3 and a textile 4, wherein the textile 4 is stitched to the temperature controllable textile 3. The location of the temperature controllable textile 3 is corresponding to the location of a wrist of the hand H. The inside of the temperature controllable textile 3 (the side in contact with the wrist) can be designed to be the cooling end, and the outside of the temperature controllable textile 3 (the side not in contact with the wrist) can be designed to be the heating end, thus making the wearer feel cool in the hot environment. By contrast, the outside of the temperature controllable textile 3 (the side not in contact with the wrist) can be designed to be the cooling end, and the inside of the temperature controllable textile 3 (the side in contact with the wrist) can be designed to be the heating end, thus making the wearer feel warm in the cold environment. The way of determining the cooling end and the heating end is explained above. As shown in FIG. 3, whether the junction portions function as the heating end and the cooling end respectively or function as the cooling end and the heating end respectively depends on the types of the first conductive type semiconductor film 32A and the second conductive type semiconductor film 32B (i.e. "N-type and P-type" or "P-type and N-type") and the connection manner of the positive end and the negative end of the direct current power $V_{DC}$. It is worth noting that if the positive end and the negative end of the direct current power $V_{DC}$ are changed to electrically connect to the conductive cloths 31A and 31B respectively, the cooling end and the heating end swap their positions.

Figure 5A:
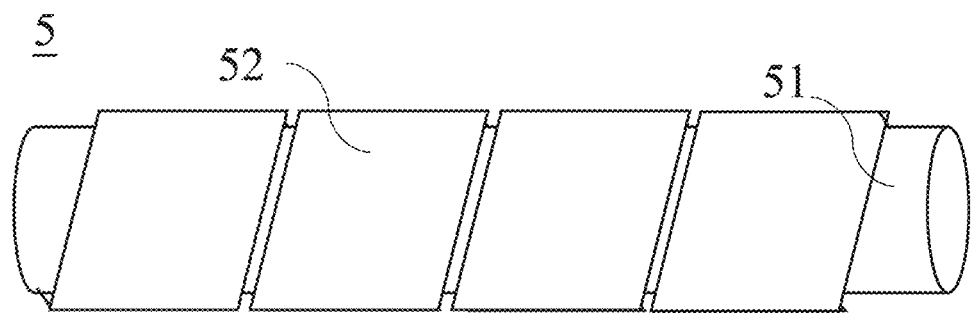
FIG. 5A is a three-dimensional diagram of a signaling yarn according to an embodiment of the present disclosure.
Figure 5B:
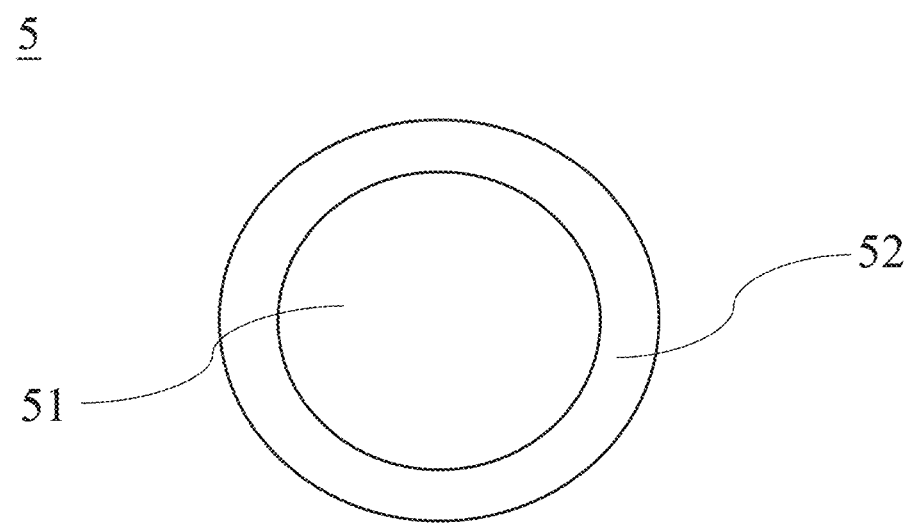
FIG. 5B is a cross sectional view of a signaling yarn according to an embodiment of the present disclosure.

Next, referring both of FIG. 5A and FIG. 5B, FIG. 5A is a three-dimensional diagram of a signaling yarn according to an embodiment of the present disclosure, and FIG. 5B is a cross sectional view of a signaling yarn according to an embodiment of the present disclosure. The signaling yarn 5 comprises a staple fiber 51 and a sheet conductor 52. The staple fiber 51 acts as the supporting material to support the sheet conductor 52 which enlaces the staple fiber 51. Specifically, the sheet conductor 52 enlaces a surrounding surface of the staple fiber 51 by taking a spiral course. That the sheet conductor 52 enlaces a surrounding surface of the staple fiber 51 by taking a spiral course can increase the anti-tear strength of the signaling yarn 5.

Optionally, the anti-tear strength of the signaling yarn 5 can be further increased by selecting the strength of the staple fiber 51 and/or an aspect ratio of a cross section of the sheet conductor 52 corresponding to the spiral course taken. In this embodiment, the strength of the staple fiber 51 is selected to be 30 strands, and the aspect ratio of the cross section of the sheet conductor 52 corresponding to the spiral course taken is selected to be about 20, but the present disclosure is not limited thereto. For example, the staple fiber 51 may have the strength of 26, 28, or 40 strands, or the aspect ratio of the cross section of the sheet conductor 52 corresponding to the spiral course taken may be selected to be about between 10 and 30.

In the embodiment, a material of the staple fiber 51 is selected from polyester, polyamides, polyacrylonitriles, polyethylenes, polypropylenes, celluloses, proteins, elastic fibers, poly perfluoroethylene, polyparaphenylene benzoxazole, polyether ketone, carbon and glass fiber, and the present disclosure is not limited thereto. The material of the short staple fiber 51 can be selected as needed. Additionally, the material of the sheet conductor 52 is the metal or the metal oxide, with electric conductivity.

Figure 5C:
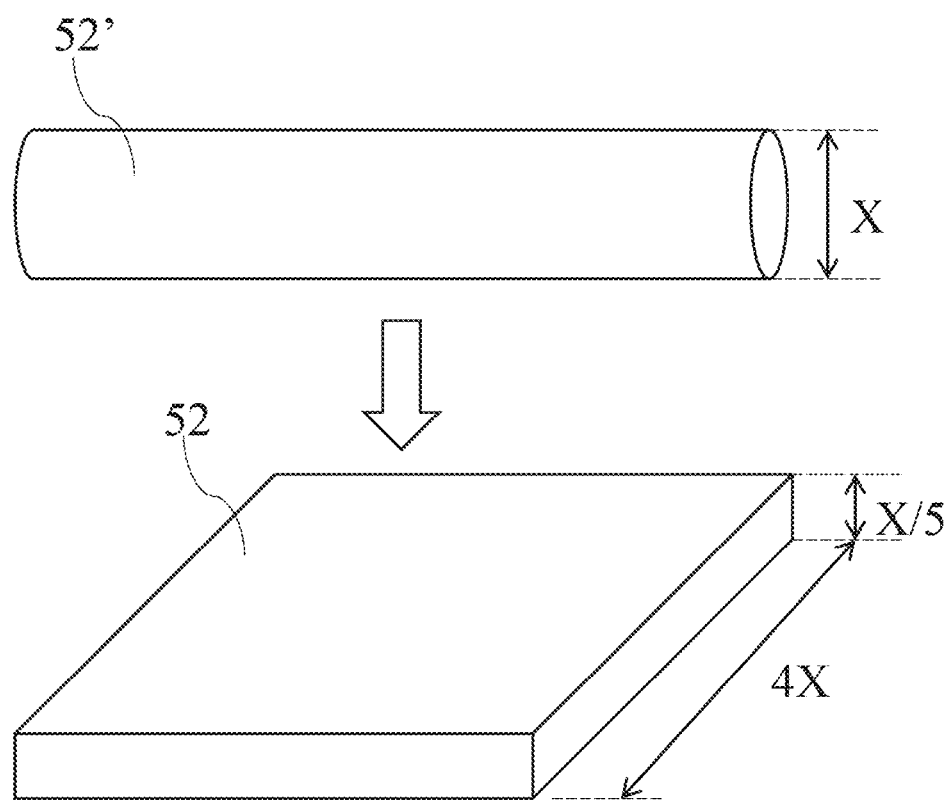
FIG. 5C is a schematic diagram showing formation of a sheet conductor of a signaling yarn according to an embodiment of the present disclosure.

Referring to FIG. 5C, FIG. 5C is a schematic diagram showing formation of a sheet conductor of a signaling yarn according to an embodiment of the present disclosure. In the embodiment, a length and a width of the cross section of the sheet conductor 52 are approximately 4X and X/5 respectively, wherein X is a diameter of the circular cross section of the conductive wire 52'. The conductive wire 52' is rolled by a rolling miller to form the sheet conductor 52. However, the formation of the sheet conductor 42 is not intended to limit the present disclosure. In other words, there are different implementations of the sheet conductor 52 of the embodiment of the present disclosure.

Referring to FIG. 3 and FIG. 5A through FIG. 5C, in the embodiment of FIG. 3, the sheet conductors 52 of the signaling yarns 5 of the conductive cloths 31A, 31B, 33 have the same material. In addition, to make the junction portions (i.e. interfaces) between the conductive cloth 31A, 31B, 33 and the first and second conductive type semiconductor films 32A, 32B have large area, the sheet conductors 52 of the signaling yarns of the conductive cloth 31A, 31B, 33 should be in contact with the first conductive type semiconductor film 32A and second conductive type semiconductor film 32B, and thus the insulation layers cannot be utilized to cover the outer layer of the signaling yarns 5. Preferably, as show in FIG. 3, when controlling the temperature of the living body, the insulated heat-conductive films 34 and 35 can be disposed under the conductive cloths 31A, 31B respectively and on the conductive cloth 33.

In addition, there are several implementations for implementing the embodiment of FIG. 3. Implementations of the first conductive type semiconductor yarn, the second conductive type semiconductor yarn, the undoped semiconductor yarn and the composite semiconductor yarn are similar to that of the signaling yarn 5 of FIG. 5A and FIG. 5B. The first conductive type semiconductor yarn, the second conductive type semiconductor yarn, the undoped semiconductor yarn and the composite semiconductor yarn each have the staple fiber functioning as the supporting material, and a first conductive type sheet semiconductor, a second conductive type sheet semiconductor, an undoped sheet semiconductor and a composite sheet semiconductor respectively enlace the surrounding surfaces of the staple fibers 51 of the first conductive type semiconductor yarn, the second conductive type semiconductor yarn, the undoped semiconductor yarn and the composite semiconductor yarn. The composite sheet semiconductor is formed by sequentially connecting the first conductive type sheet semiconductor, the undoped sheet semiconductor and the second conductive type sheet semiconductor, so as to define the locations of the first conductive type semiconductor film 32A, the insulation film 32C and the second conductive type semiconductor film 32B in FIG. 3. Preferably, the strength of the staple fiber 51 can be selected to be 30 strands, and aspect ratios of a cross section of the first conductive type sheet semiconductor, the second conductive type sheet semiconductor, the undoped sheet semiconductor and the composite sheet semiconductor corresponding to the spiral course taken is selected to be 20, but the present disclosure is not limited thereto.

Figure 6:
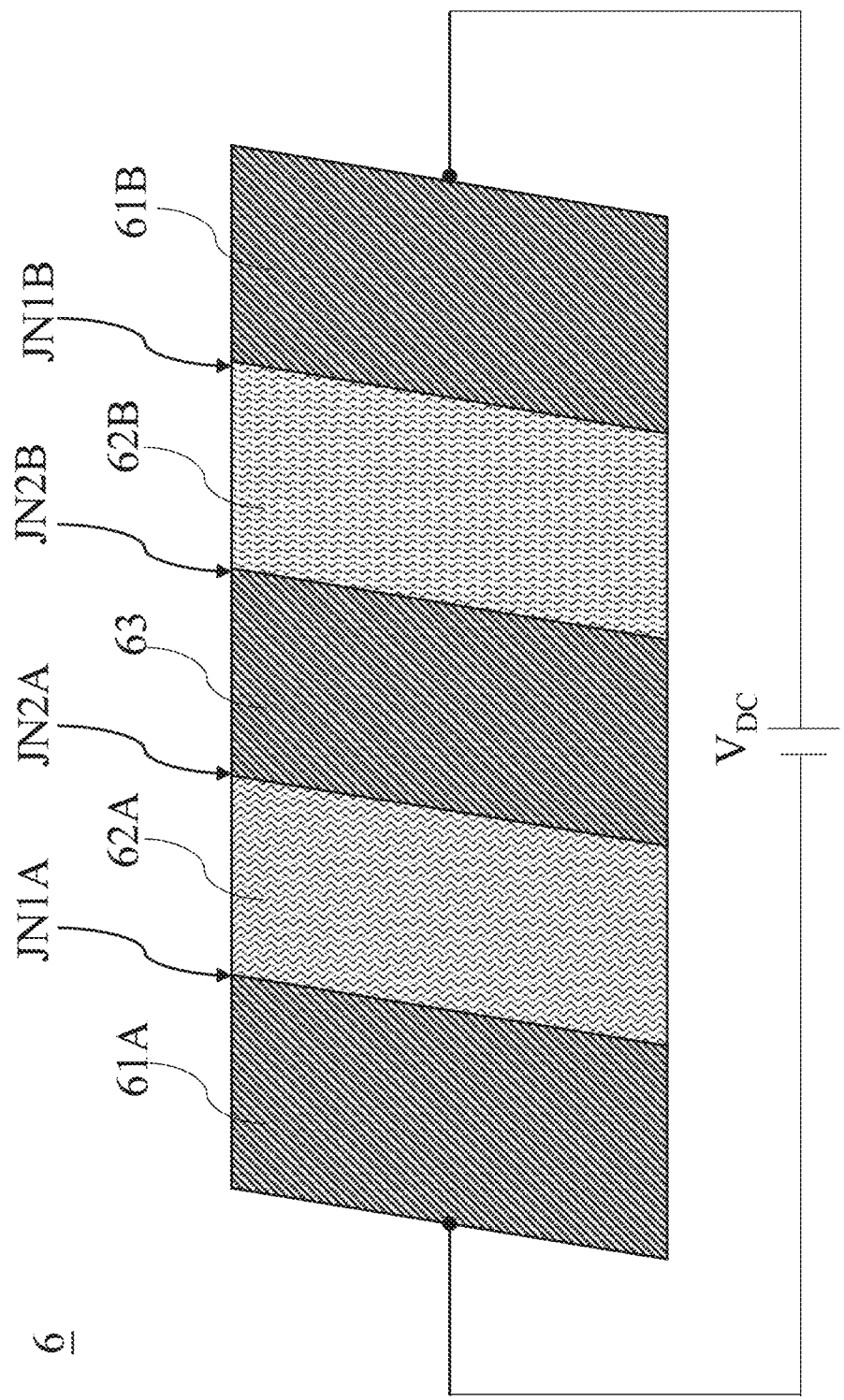
FIG. 6 is a plan view of a temperature controllable textile according to another embodiment of the present disclosure.

Next, referring to FIG. 6, FIG. 6 is a plan view of a temperature controllable textile according to another embodiment of the present disclosure. In the embodiment, the cooling end and the heating end in the embodiment are designed to be lines rather than the planes in the embodiment of FIG. 3. The temperature controllable textile 6 comprises conductive cloths 61A, 63, 61B, the first conductive type semiconductor film 62A and the second conductive type semiconductor film 62B. The first conductive type semiconductor film 62A electrically connects to the conductive cloths 61A, 63, and is in contact with the conductive cloths 61A, 63, to form junction portions JN1A and JN2A. The second conductive type semiconductor film 62B electrically connects to the conductive cloths 63, 61B, and is in contact with the conductive cloths 63, 61B, to form junction portions JN2B and JN1B.

When a positive end and a negative end of a direct current power $V_{DC}$ electrically connect to the conductive cloths 61B, 61A respectively, and the first conductive type semiconductor film 62A and the second conductive type semiconductor film 62B are the P-type and N-type semiconductor films respectively, the junction portions JN1A and JN1B can function as the cooling end, and the junction portions JN2A and JN2B can function as the heating end. When the temperature controllable textile 6 is to be used, the temperature controllable textile 6 can be rolled, such that the junction portions JN1A and JN1B can be in contact with the object or the living body to meet heat dissipation demands, and the junction portions JN2A and JN2B can be in contact with the outer environment, the object or the living body to meet heat absorption demands.

In an embodiment of the present disclosure, the conductive cloths 61A, 61B, 63 are formed of signaling yarns, and the first conductive type semiconductor film 62A and the second conductive type semiconductor film 62B can be formed of flexible semiconductor substrates with different conductive type dopants. In another embodiment, the first conductive type semiconductor film 62A and the second conductive type semiconductor film 62B are formed of cloths, and that is, the first conductive type semiconductor film 62A is implemented as a cloth which is formed by weaving first conductive type semiconductor yarns, and the second conductive type semiconductor film 62B is implemented as a cloth which is formed by weaving second conductive type semiconductor yarns.

In another embodiment, the conductive cloths 61A, 63, 61B, the first conductive type semiconductor film 62A and the second conductive type semiconductor film 62B can be implemented as a cloth being integrally formed, and the cloth is formed by weaving the temperature controllable yarns.

Figure 7A:
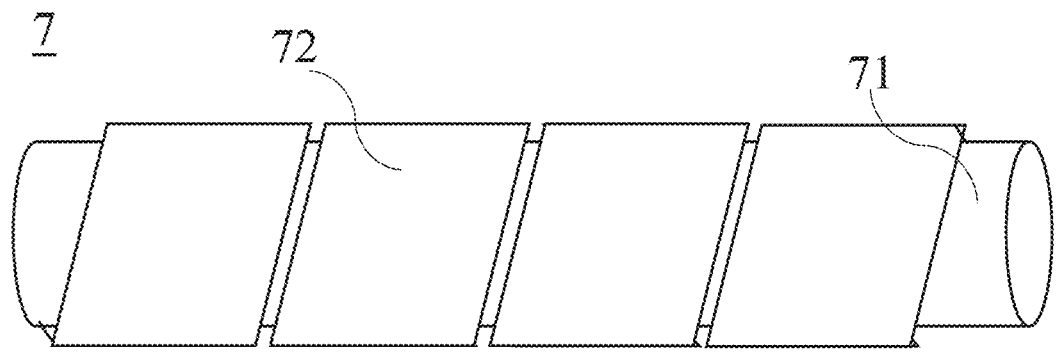
FIG. 7A is a three-dimensional diagram of a temperature controllable yarn according to an embodiment of the present disclosure.
Figure 7B:
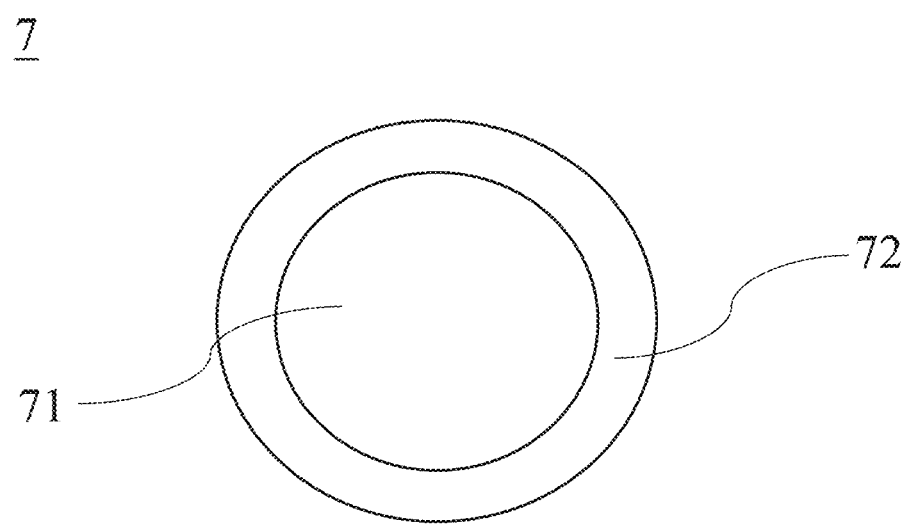
FIG. 7B is a cross sectional view of a temperature controllable yarn according to an embodiment of the present disclosure.

Referring to FIG. 7A and FIG. 7B, FIG. 7A is a three-dimensional diagram of a temperature controllable yarn according to an embodiment of the present disclosure, and FIG. 7B is a cross sectional view of a temperature controllable yarn according to an embodiment of the present disclosure. The temperature controllable yarn 7 comprises a staple fiber 71 and a composite temperature sheet 72. The staple fiber 71 acts as the supporting material with the material and the strength as mentioned above. The composite temperature sheet 72 enlaces the surrounding surface of the staple fiber 71 by taking a spiral course. In another embodiment, the temperature controllable yarn 7 further comprises a heat-conductive insulation layer (not shown in the drawings) for covering the staple fiber 71 and the composite temperature sheet 72.

Figure 7C:
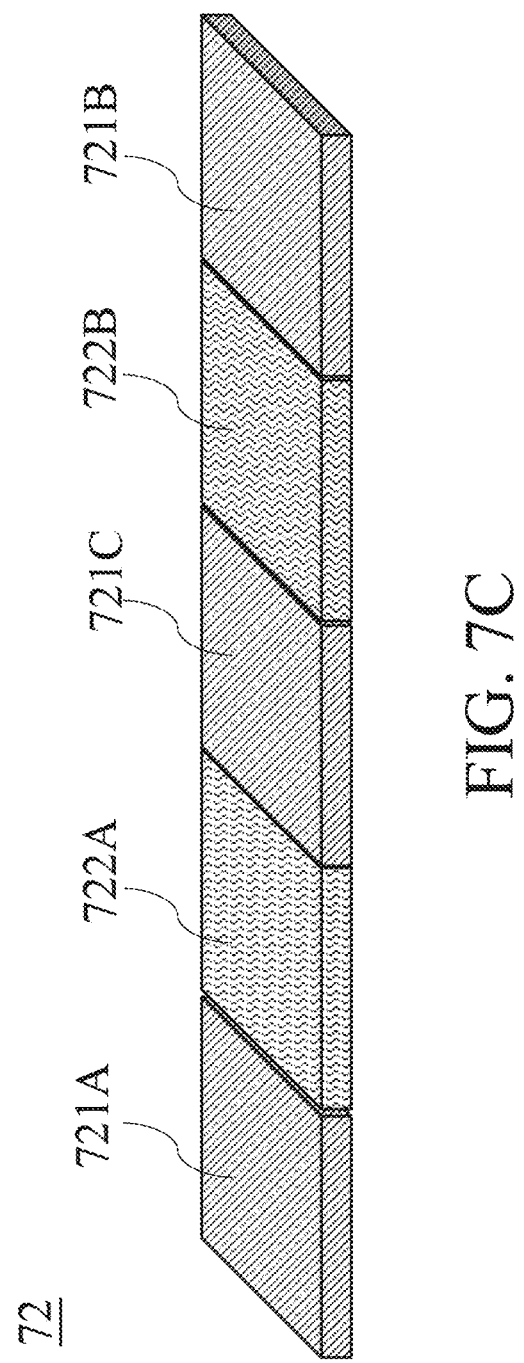
FIG. 7C is a schematic diagram of a composite temperature sheet of a temperature controllable yarn according to an embodiment of the present disclosure.

Next, details of the composite temperature sheet 72 are illustrated. Referring to FIG. 7C, FIG. 7C is a schematic diagram of a composite temperature sheet of a temperature controllable yarn according to an embodiment of the present disclosure. The composite temperature sheet 72 is implemented as a sheet which is formed by sequentially connecting a sheet conductor 721A, a first conductive type sheet semiconductor 722A, a sheet conductor 721C, a second conductive type sheet semiconductor 722B and a sheet conductor 721B, wherein locations of the sheet conductor 721A, the first conductive type sheet semiconductor 722A, the sheet conductor 721C, the second conductive type sheet semiconductor 722B and the sheet conductor 721B defines locations of the conductive cloth 61A, the first conductive type semiconductor film 62A, the conductive cloth 63, the second conductive type semiconductor film 62B and the conductive cloth 61B in FIG. 6.

To sum up, the temperature controllable textile provided in the embodiment of the present disclosure utilizes the junction portions which the first and second conductive type semiconductor films contact the conductive cloths as the cooling end and the heating end, so as to achieve the objective of controlling the temperature of the object or the living body. Since the temperature controllable textile has the water washable and anti-tear characteristics, and can be a part of the wearable assembly, therefore facilitating the wearer to wash the wearable assembly. Moreover, the temperature controllable textile can be in the form of the textile and thus is not perceived as a foreign body by the wearer; hence, the wearable assembly formed by the temperature controllable textile provides a satisfactory wearing experience to the wearer.

The above is only embodiments of the present disclosure, and these embodiments are not intended to limit the scope of the present disclosure.

What is claimed is:

1. A temperature controllable textile, comprising:
   first, second and third conductive cloths;
   a first conductive type semiconductor film, electrically connecting to the first and the third conductive cloths, and contacting the first and the third conductive cloths, to form a first junction portion between the first conductive type semiconductor film and the first conductive cloth and a second junction portion between the first conductive type semiconductor film and the third conductive cloth; and
   a second conductive type semiconductor film, electrically connecting to the first and third conductive cloths, and contacting the second and third conductive cloths, to form a third junction portion between the second conductive type semiconductor film and the second conductive cloth and a fourth junction portion between the second conductive type semiconductor film and the third conductive cloth;
   wherein, when a positive end and a negative end of a direct current power electrically connect to the first and second conductive cloths respectively, the first and third junction portions function as a cooling end, and the second and fourth junction portions function as a heating end, or the first and third junction portions function as the heating end, and the second and fourth junction portions function as the cooling end.

2. The temperature controllable textile according to claim 1, further comprising:
   an insulation cloth, connected between the first and second conductive cloths, and contacting the first and second conductive cloths; and
   an insulation film, disposed corresponding to the insulation cloth, connected between the first and second conductive type semiconductor films, and contacting the first and second conductive type semiconductor films.

3. The temperature controllable textile according to claim 2, further comprising:
   a first insulated heat-conductive film, disposed under the first and second conductive cloths; and
   a second insulated heat-conductive film, disposed on the third conductive cloth.

4. The temperature controllable textile according to claim 2, wherein the first conductive type semiconductor film, the insulation film and the second conductive type semiconductor film are formed by a flexible semiconductor film, wherein the flexible semiconductor film has a first conductive type doping region, a second conductive type doping region, and an undoped region, wherein the undoped region is disposed between the first and second conductive type doping regions.

5. The temperature controllable textile according to claim 1, wherein the first, second and third conductive cloths each have a plurality of signaling yarns, and the signaling yarn comprises:
   a staple fiber, having a strength of 26 to 40 strands, and acting as a supporting material; and
   a sheet conductor, enlacing a surrounding surface of the staple fiber by taking a spiral course.

6. The temperature controllable textile according to claim 2, wherein the first conductive type semiconductor film, the insulation film and the second conductive type semiconductor film are respectively formed of a first conductive type semiconductor cloth, an insulation cloth and a second conductive type semiconductor cloth.

7. The temperature controllable textile according to claim 6, wherein the first conductive type semiconductor cloth comprises a plurality of first conductive type semiconductor yarns, and the second conductive type semiconductor cloth comprises a plurality of second conductive type semiconductor yarns;
   the first conductive type semiconductor yarn comprises a first staple fiber and a first conductive type sheet semiconductor which enlaces a surrounding surface of the first staple fiber by taking a spiral course; and the second conductive type semiconductor yarn comprises a second staple fiber and a second conductive type sheet semiconductor which enlaces a surrounding surface of the second staple fiber by taking a spiral course.

8. The temperature controllable textile according to claim 2, wherein the first conductive type semiconductor film, the insulation film and the second conductive type semiconductor film are integrally formed of a semiconductor cloth, wherein the semiconductor cloth comprises a plurality of composite semiconductor yarns, and the composite semiconductor yarn comprises a staple fiber and a composite sheet semiconductor which enlaces a surrounding surface of the staple fiber by taking a spiral course, wherein the composite sheet semiconductor is formed by sequentially connecting a first conductive type sheet semiconductor, an undoped sheet semiconductor and a second conductive type sheet semiconductor.

9. The temperature controllable textile according to claim 1, wherein the first, second and third conductive cloths and the first and second conductive type semiconductor films are integrally formed a cloth, wherein the cloth comprises a plurality of temperature controllable yarns, wherein the temperature controllable yarn comprises a staple fiber and a composite temperature sheet which enlaces a surrounding surface of the staple fiber by taking a spiral course, wherein the composite temperature sheet is formed by sequentially connecting a first sheet conductor, a first conductive type sheet semiconductor, a second sheet conductor, a second conductive type sheet semiconductor and a third sheet conductor.

10. A wearable assembly, comprising a temperature controllable textile, and the temperature controllable textile comprising:
    first, second and third conductive cloths;

a first conductive type semiconductor film, electrically connecting to the first and the third conductive cloths, and contacting the first and the third conductive cloths, to form a first junction portion between the first conductive type semiconductor film and the first conductive cloth and a second junction portion between the first conductive type semiconductor film and the third conductive cloth; and a second conductive type semiconductor film, electrically connecting to the first and third conductive cloths, and contacting the second and third conductive cloths, to form a third junction portion between the second conductive type semiconductor film and the second conductive cloth and a fourth junction portion between the second conductive type semiconductor film and the third conductive cloth;

wherein, when a positive end and a negative end of a direct current power electrically connect to the first and second conductive cloths respectively, the first and third junction portions function as a cooling end, and the second and fourth junction portions function as a heating end, or the first and third junction portions function as the heating end, and the second and fourth junction portions function as the cooling end.

11. The wearable assembly according to claim 10, wherein the temperature controllable textile further comprising:
an insulation cloth, connected between the first and second conductive cloths, and contacting the first and second conductive cloths; and
an insulation film, disposed corresponding to the insulation cloth, connected between the first and second conductive type semiconductor films, and contacting the first and second conductive type semiconductor films.

12. The wearable assembly according to claim 11, wherein the temperature controllable textile further comprising:
a first insulated heat-conductive film, disposed under the first and second conductive cloths; and
a second insulated heat-conductive film, disposed on the third conductive cloth.

13. The wearable assembly according to claim 11, wherein the first conductive type semiconductor film, the insulation film and the second conductive type semiconductor film are formed by a flexible semiconductor film, wherein the flexible semiconductor film has a first conductive type doping region, a second conductive type doping region, and an undoped region, wherein the undoped region is disposed between the first and second conductive type doping regions.

14. The wearable assembly according to claim 10, wherein the first, second and third conductive cloths each have a plurality of signaling yarns, and the signaling yarn comprises:

a staple fiber, having a strength of 26 to 40 strands, and acting as a supporting material; and a sheet conductor, enlacing a surrounding surface of the staple fiber by taking a spiral course.

15. The wearable assembly according to claim 11, wherein the first conductive type semiconductor film, the insulation film and the second conductive type semiconductor film are respectively formed of a first conductive type semiconductor cloth, an insulation cloth and a second conductive type semiconductor cloth.

16. The wearable assembly according to claim 15, wherein the first conductive type semiconductor cloth comprises a plurality of first conductive type semiconductor yarns, and the second conductive type semiconductor cloth comprises a plurality of second conductive type semiconductor yarns;

the first conductive type semiconductor yarn comprises a first staple fiber and a first conductive type sheet semiconductor which enlaces a surrounding surface of the first staple fiber by taking a spiral course; and the second conductive type semiconductor yarn comprises a second staple fiber and a second conductive type sheet semiconductor which enlaces a surrounding surface of the second staple fiber by taking a spiral course.

17. The wearable assembly according to claim 11, wherein the first conductive type semiconductor film, the insulation film and the second conductive type semiconductor film are integrally formed of a semiconductor cloth, wherein the semiconductor cloth comprises a plurality of composite semiconductor yarns, and the composite semiconductor yarn comprises a staple fiber and a composite sheet semiconductor which enlaces a surrounding surface of the staple fiber by taking a spiral course, wherein the composite sheet semiconductor is formed by sequentially connecting a first conductive type sheet semiconductor, an undoped sheet semiconductor and a second conductive type sheet semiconductor.

18. The wearable assembly according to claim 10, wherein the first, second and third conductive cloths and the first and second conductive type semiconductor films are integrally formed a cloth, wherein the cloth comprises a plurality of temperature controllable yarns, wherein the temperature controllable yarn comprises a staple fiber and a composite temperature sheet which enlaces a surrounding surface of the staple fiber by taking a spiral course, wherein the composite temperature sheet is formed by sequentially connecting a first sheet conductor, a first conductive type sheet semiconductor, a second sheet conductor, a second conductive type sheet semiconductor and a third sheet conductor.

* * * * *